(12) United States Patent
Tajima et al.

(10) Patent No.: US 11,024,717 B2
(45) Date of Patent: Jun. 1, 2021

(54) SEMICONDUCTOR DEVICE AND METHOD OF MANUFACTURING SEMICONDUCTOR DEVICE

(71) Applicant: Kabushiki Kaisha Toshiba, Minato-ku (JP)

(72) Inventors: Jumpei Tajima, Mitaka (JP); Toshiki Hikosaka, Kawasaki (JP); Kenjiro Uesugi, Kawasaki (JP); Masahiko Kuraguchi, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 36 days.

(21) Appl. No.: 16/118,586

(22) Filed: Aug. 31, 2018

(65) Prior Publication Data
US 2019/0296111 A1  Sep. 26, 2019

(30) Foreign Application Priority Data

Mar. 22, 2018 (JP) .............................. JP2018-054818

(51) Int. Cl.
*H01L 29/20* (2006.01)
*H01L 29/205* (2006.01)
(Continued)

(52) U.S. Cl.
CPC ...... *H01L 29/2003* (2013.01); *H01L 23/5329* (2013.01); *H01L 29/205* (2013.01);
(Continued)

(58) Field of Classification Search
CPC combination set(s) only.
See application file for complete search history.

(56) References Cited

U.S. PATENT DOCUMENTS 9,379,195 B2 *  6/2016  Khalil ................. H01L 29/4236
9,590,060 B2 *  3/2017  Lal ....................... H01L 29/7787
(Continued)

FOREIGN PATENT DOCUMENTS

JP  2009-503810  1/2009
JP  2010/021099  2/2010
(Continued)

*Primary Examiner* — Mounir S Amer
(74) *Attorney, Agent, or Firm* — Oblon, McClelland, Maier & Neustadt, L.L.P.

(57) ABSTRACT

In one embodiment, a semiconductor device is provided with a substrate, a first nitride semiconductor layer above the substrate, a second nitride semiconductor layer which is provided on the first nitride semiconductor layer and is in contact with the first nitride semiconductor layer, a source electrode provided between the substrate and the first nitride semiconductor layer and electrically connected to the first nitride semiconductor layer, a drain electrode provided on the second nitride semiconductor layer and electrically connected to the second nitride semiconductor layer, a gate insulating layer provided at least between the substrate and the first nitride semiconductor layer, a gate electrode between the substrate and the gate insulating layer, and a first insulating layer between the substrate and the gate insulating layer to cover the gate electrode and the source electrode.

15 Claims, 7 Drawing Sheets

(51) Int. Cl.
*H01L 29/778* (2006.01)
*H01L 29/66* (2006.01)
*H01L 23/532* (2006.01)
*H01L 29/417* (2006.01)
*H01L 29/423* (2006.01)
*H01L 29/207* (2006.01)

(52) U.S. Cl.
CPC ...... *H01L 29/207* (2013.01); *H01L 29/41725* (2013.01); *H01L 29/42372* (2013.01); *H01L 29/66462* (2013.01); *H01L 29/7783* (2013.01); *H01L 29/7789* (2013.01)

(56) References Cited

U.S. PATENT DOCUMENTS

| | | | |
|---|---|---|---|
| 2006/0231861 A1* | 10/2006 | Akamatsu | H01L 29/0692 257/192 |
| 2007/0007547 A1 | 1/2007 | Beach | |
| 2007/0275500 A1* | 11/2007 | Suwa | H01B 1/02 438/99 |
| 2008/0063566 A1* | 3/2008 | Matsumoto | G01N 27/4145 422/68.1 |
| 2009/0072272 A1* | 3/2009 | Suh | H01L 29/1066 257/194 |
| 2009/0108738 A1* | 4/2009 | Kwak | G09G 3/3208 313/504 |
| 2010/0207164 A1 | 8/2010 | Shibata et al. | |
| 2017/0229565 A1 | 8/2017 | Jun et al. | |

FOREIGN PATENT DOCUMENTS

| | | |
|---|---|---|
| JP | 2010-109086 | 5/2010 |
| JP | 2011-243605 | 12/2011 |
| JP | 2013-84782 | 5/2013 |
| JP | 2013-84783 | 5/2013 |
| JP | 5202312 | 6/2013 |

* cited by examiner

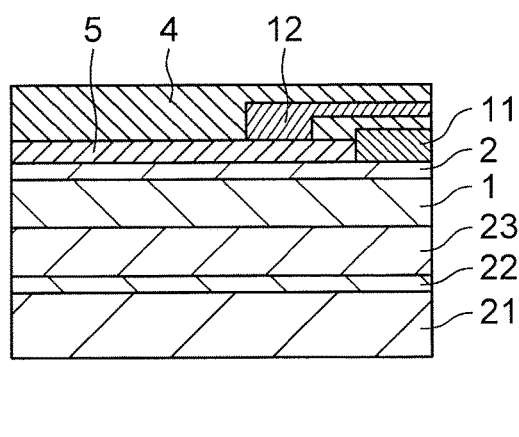
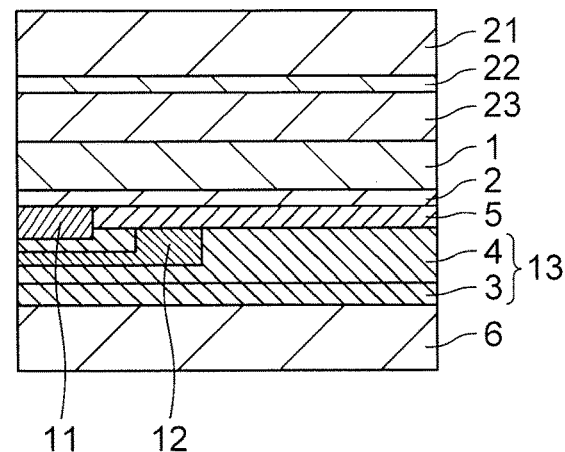
FIG. 2A          FIG. 2B
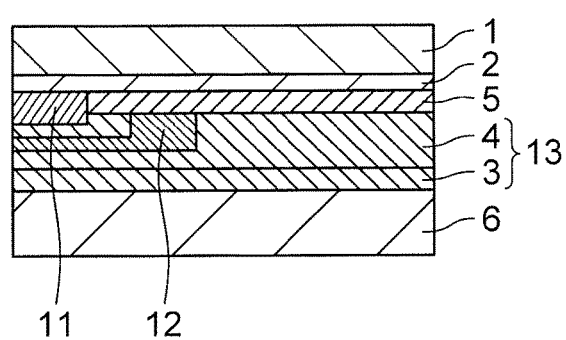
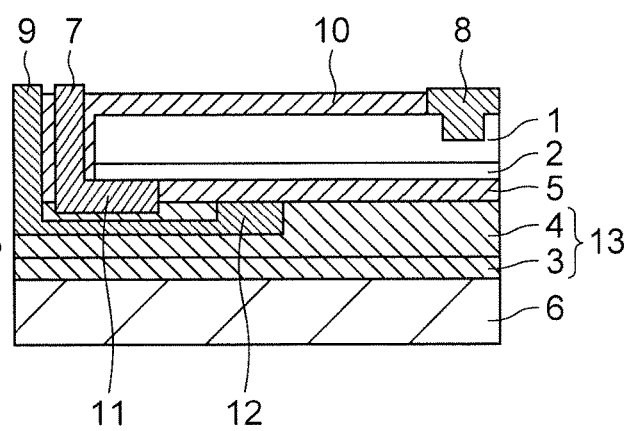
FIG. 2C          FIG. 2D

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from the prior Japanese Patent Application No. 2018-054818, filed on Mar. 22, 2018, the entire contents of which are incorporated herein by reference.

FIELD

Embodiments described herein relate generally to a semiconductor device and a method of manufacturing a semiconductor device.

BACKGROUND

In a transistor using a nitride semiconductor, high withstand characteristics are obtained, due to electrical material characteristics of the nitride semiconductor that is a material with a wide band gap, and such a transistor becomes a semiconductor device that replaces a power device using silicon.

A two-dimensional electron gas is generated at a lamination interface of nitride semiconductor layers with different compositions of constituent elements. Since the two-dimensional electron gas has a high electron mobility, the transistor using two-dimensional electron gas as a channel can electrically perform a high speed response, and when the transistor is used as a high speed switching device, a high energy conversion efficiency is obtained.

The transistor using the nitride semiconductor like this has a high withstand voltage and high speed responsiveness, and thereby it is expected that the transistor like this is used for a power conversion device such as a power source.

The transistor using the nitride semiconductor has a structure in which a nitride semiconductor layer acting as a withstand voltage buffer layer, and a nitride semiconductor layer acting as a channel layer are laminated in this order on a substrate made of silicon (Si) or the like, for example, for obtaining high withstand voltage characteristics. However, electrons leaked out from the channel layer might be stored in the withstand voltage buffer layer and the Si substrate, and this causes current collapse. For the reason, a semiconductor device having a high withstand voltage in which current collapse is suppressed is expected.

BRIEF DESCRIPTION OF THE DRAWINGS

FIGS. 2A-2D are diagrams each showing a manufacturing process of the semiconductor device of the first embodiment.

DETAILED DESCRIPTION

Figure 1:
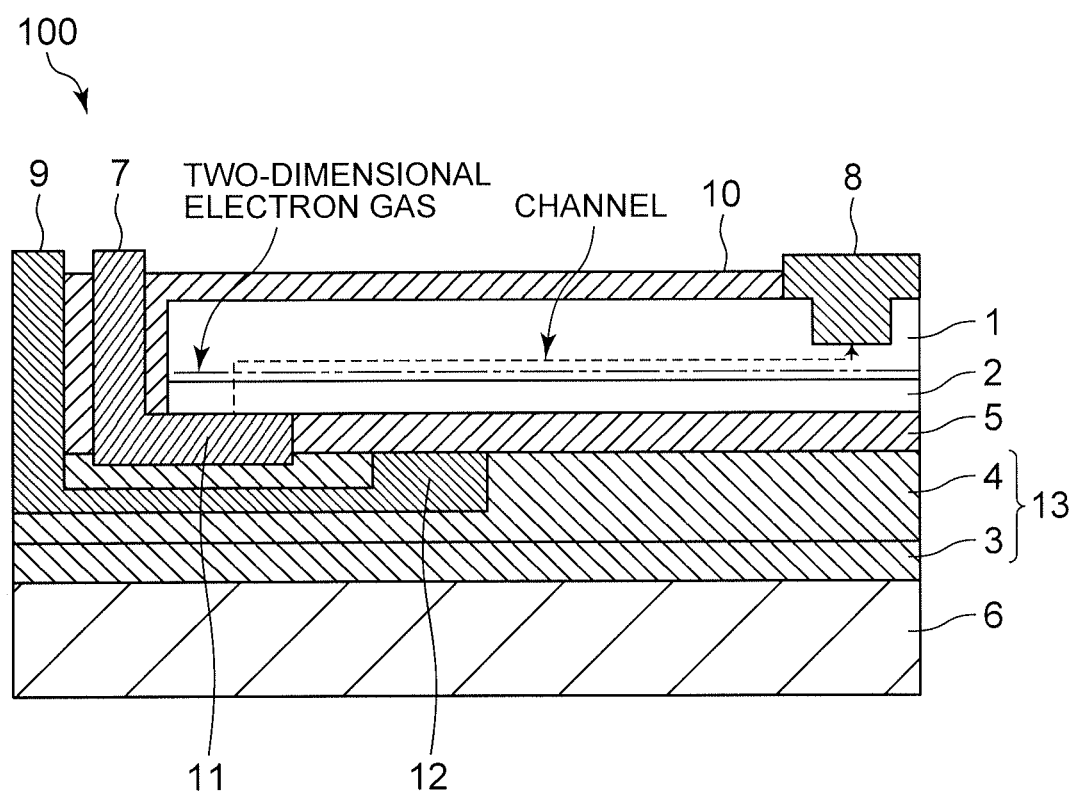
FIG. 1 is a schematic sectional view of a semiconductor device of a first embodiment.

According to one embodiment, a semiconductor device is provided with a substrate, a first nitride semiconductor layer above the substrate, a second nitride semiconductor layer which is provided on the first nitride semiconductor layer and is in contact with the first nitride semiconductor layer, a source electrode provided between the substrate and the first nitride semiconductor layer and electrically connected to the first nitride semiconductor layer, a drain electrode provided on the second nitride semiconductor layer and electrically connected to the second nitride semiconductor layer, a gate insulating layer provided at least between the substrate and the first nitride semiconductor layer, a gate electrode between the substrate and the gate insulating layer, and a first insulating layer between the substrate and the gate insulating layer to cover the gate electrode and the source electrode.

Hereinafter, embodiments of the present invention will be described with reference to the drawings. Ones with the same symbols show the similar ones. In addition, the drawings are schematic or conceptual, and accordingly, the relation between a thickness and a width of each portion, and a ratio coefficient of sizes between portions are not necessarily identical to those of the actual ones. In addition, even when the same portions are shown, the dimensions and the ratio coefficient thereof may be shown different depending on the drawings.

In the present specification, in order to indicate the position relation of components and so on, an upward direction in the drawing is stated as "up or upward", and a downward direction in the drawing is stated as "down or downward". In the present specification, the concepts of "up or upward" and "down or downward" are not necessarily terms indicating the relation with the direction of the gravity.

In the present specification, "a gallium nitride based semiconductor" is a general term of a semiconductor containing gallium nitride (GaN), aluminum nitride (AlN), indium nitride (InN), and an intermediate composition thereof.

(First embodiment) FIG. 1 shows a schematic sectional view for describing a semiconductor device 100 of the present embodiment.

The semiconductor device 100 is a field effect transistor (Field Effect Transistor: FET) composed of a GaN based semiconductor.

The semiconductor device 100 is provided with a structure in which a first insulating layer 13, a gate insulating layer 5, a second nitride semiconductor layer 2, a first nitride semiconductor layer 1, and a second insulating layer 10 are laminated in this order on a substrate 6. The second nitride semiconductor layer 2 has a composition different from the first nitride semiconductor layer 1. The second nitride semiconductor layer 2 operates as an electron supply layer, and the first nitride semiconductor layer 1 generates a two-dimensional electron gas and becomes a channel layer.

In addition, a source electrode 11 is provided between a part of the first insulating layer 13 and a part of the second nitride semiconductor layer 2. A drain electrode 8 is provided on the first nitride semiconductor layer 1. A gate electrode 12 is provided between the substrate 6 and the gate insulating layer 5. In addition, the gate electrode 12 is provided in the first insulating layer 13. The first insulating layer 13 includes a bonding insulating layer 3 and an interlayer insulating layer 4, and the both are laminated.

In order to improve a withstand voltage, a conventional nitride semiconductor device has been provided with a thick nitride semiconductor layer that is a withstand voltage buffer layer, between a substrate and nitride semiconductor layers acting as a channel layer and an electron supply layer.

However, the semiconductor device 100 of the present embodiment has the first insulating layer 13 in place of the nitride semiconductor layer that is the withstand voltage buffer layer, and the semiconductor device 100 is provided with a structure in which the second nitride semiconductor layer 2 that is the electron supply layer and the first nitride semiconductor layer 1 that is the channel layer are laminated on the first insulating layer 13. The first insulating layer 13 has a wider band gap compared with the nitride semiconductor layer, and thereby has a higher withstand voltage than the nitride semiconductor. Accordingly, it is possible to improve the withstand voltage of the semiconductor device 100. In addition, the first insulating layer 13 does not store electrons which have leaked out from the channel or does not allow the electrons to pass there through, and thereby the electrons are prevented from leaking out from the channel to the first insulating layer 13, and accordingly, it is possible to reduce current collapse.

The substrate 6 is made of silicon (Si), gallium oxide ($Ga_2O_3$), silicon carbide (SiC), sapphire ($Al_2O_3$), gallium nitride (GaN), aluminum nitride (AlN), or the like, for example. As the substrate 6, not only a single crystal substrate, but also a low cost polycrystal substrate, or a substrate of metal such as copper (Cu), aluminum (Al) or the like can be used. It is desirable that a metal substrate having a high heat conductivity or nitride aluminum (AlN) is used as the substrate 6, for improving heat dissipation.

Semiconductor layers and insulating layers which are described later are laminated on the substrate 6, and thereby the substrate 6 fixes the semiconductor layers and the insulating layers. A thickness of the substrate 6 is not less than 100 μm and not more than 2000 μm, for example.

The first insulating layer 13 is provided on the substrate 6. The first insulating layer 13 includes the bonding insulating layer 3 and the interlayer insulating layer 4. An arbitrary insulator may be used as the first insulating layer 13, in consideration of the degree of improving the withstand voltage of the semiconductor device 100. For example, at least one kind selected from silicon oxide, silicon nitride, silicon oxynitride, aluminum oxide, aluminum oxynitride, aluminum silicate is used as the first insulating layer 13. In addition, the first insulating layer 13 may have a structure in which a plurality of layers each made of two or more different materials out of these insulators are laminated. A thickness of the first insulating layer 13 is not less than 1 μm and not more than 5 μm, for example.

The second nitride semiconductor layer 2 is provided on the first insulating layer 13. The second nitride semiconductor layer 2 is an aluminum gallium nitride ($Al_{x1}Ga_{(1-x1)}N$, 0<x1≤1) layer, for example. Hereinafter, aluminum gallium nitride is written as AlGaN.

The second nitride semiconductor layer 2 is an electron supply layer. The second nitride semiconductor layer 2 is an i-AlGaN layer that is an undoped layer, for example. The second nitride semiconductor layer 2 may not be intentionally doped with impurities, and in this case, the second nitride semiconductor layer 2 indicates a weak n-type conductivity.

In addition, the second nitride semiconductor layer 2 may contain impurities, such as H (hydrogen), O (oxygen), Si (silicon), which are unintentionally contained. An impurity concentration of the i-AlGaN layer is not more than $1\times10^{21}$ $cm^{-3}$ when the impurity is H (hydrogen), is not more than $1\times10^{18}$ $cm^{-3}$ when the impurity is O (oxygen), and is not more than $1\times10^{18}$ $cm^{-3}$ when the impurity is Si (silicon), for example. A side of the second nitride semiconductor layer 2 at the first insulating layer 13 side is a +C surface (Ga polarity surface). Since the +C surface of the second nitride semiconductor layer 2 is flat, it is suited for making the gate electrode 12 described later contact therewith. In order to make the first nitride semiconductor layer 1 generate a two-dimensional electron gas layer, the second nitride semiconductor layer 2 which is in contact with the first nitride semiconductor layer 1 is required to have a prescribed thickness or more. Accordingly, a thickness of the second nitride semiconductor layer 2 is preferably not less than 10 nm and not more than 50 nm, for example.

The first nitride semiconductor layer 1 is provided on the second nitride semiconductor layer 2. The first nitride semiconductor layer 1 is in contact with the second nitride semiconductor layer 2. The first nitride semiconductor layer 1 is a channel layer. The first nitride semiconductor layer 1 is an aluminum gallium nitride ($Al_{x2}Ga_{(1-x2)}N$, 0≤x2<1) layer.

The first nitride semiconductor layer 1 is made of a material having a smaller band gap than the second nitride semiconductor layer 2, and the first nitride semiconductor layer 1 is an i-GaN layer or an i-AlGaN layer that is an undoped layer, for example. The first nitride semiconductor layer 1 may not be intentionally doped with impurities, and in this case, the first nitride semiconductor layer 1 indicates a weak n-type conductivity. In addition, the first nitride semiconductor layer 1 may contain impurities, such as H (hydrogen), O (oxygen), Si (silicon), which are unintentionally contained. An impurity concentration of the i-GaN layer is not more than $1\times10^{20}$ $cm^{-3}$ when the impurity is H (hydrogen), is not more than $1\times10^{18}$ $cm^{-3}$ when the impurity is O (oxygen), and is not more than $1\times10^{18}$ $cm^{-3}$ when the impurity is Si (silicon), for example. In order to enlarge an effect for improving a threshold voltage, suppress an ON resistance and improve a channel mobility, a thickness of the first nitride semiconductor layer 1 is not less than 20 nm and not more than 1 μm, for example. More preferably, it is not less than 50 nm and not more than 200 nm.

The source electrode 11 is provided between the first insulating layer 13 and the second nitride semiconductor layer 2, and is electrically connected to the second nitride semiconductor layer 2. The source electrode 11 is electrically connected to a source pad 7 via a source line. The source electrode 11 is made of ohmic metal, for example. The metal has a laminated structure of titanium (Ti), aluminum (Al), nickel (Ni), and gold (Au).

The drain electrode 8 is provided on the first nitride semiconductor layer 1, and is electrically connected to the first nitride semiconductor layer 1. The drain electrode 8 has a convex portion, and the convex portion is embedded in the first nitride semiconductor layer 1. The convex portion of the drain electrode 8 preferably extends toward the interface of the second nitride semiconductor layer 2 and the first nitride semiconductor layer 1. In order to improve the conduction of the drain electrode 8 with the channel, the convex portion of the drain electrode 8 is located preferably in the vicinity of the interface of the second nitride semiconductor layer 2 and the first nitride semiconductor layer 1. The drain electrode 8 is made of ohmic metal, for example. The metal has a laminated structure of titanium (Ti), aluminum (Al), nickel (Ni), and gold (Au).

The gate electrode 12 is provided between the substrate 6 and the second nitride semiconductor layer 2, and is embedded inside the first insulating layer 13. The gate electrode 12 is electrically connected to a gate pad 9 via a gate line. The gate electrode 12 is made of metal, for example. The metal is any of titanium (Ti), nickel (Ni), and titanium nitride (TiN), or a laminated structure of these materials.

Since the gate electrode 12 is embedded inside the first insulating layer 13, a part of the first insulating layer 13 exists between the source electrode 11 and the gate electrode 12. For the reason, the source electrode 11 and the gate electrode 12 are insulated by the first insulating layer 13.

The gate insulating layer 5 is provided between the gate electrode 12 and the second nitride semiconductor layer 2. Silicon oxide, silicon nitride, silicon oxynitride, aluminum oxide, aluminum oxynitride, aluminum silicate or the like is used as the gate insulating layer 5, for example. In addition, the gate insulating layer 5 may have a structure in which a plurality of layers each made of two or more different materials composed of these insulators are laminated. In order to prevent the carriers from leaking out from the channel of the first nitride semiconductor layer 1 to the gate electrode 12, a thickness of the gate insulating layer 5 is not less than 10 nm and not more than 100 nm, for example. A part of the gate electrode may be in contact with the nitride semiconductor layer 1 to form a Schottky junction.

The second insulating layer 10 is provided on the first nitride semiconductor layer 1. As the second insulating layer 10, an arbitrary insulator may be used in consideration of the degree of improving the withstand voltage of the semiconductor device 100. For example, silicon oxide, silicon nitride, silicon oxynitride, aluminum oxide, aluminum oxynitride, aluminum silicate is used as the second insulating layer 10. The second insulating layer 10 may have a structure in which a plurality of layers each made of two or more different materials out of these insulators are laminated. In order to prevent the carriers from leaking out from the channel of the first nitride semiconductor layer 1 outside the first nitride semiconductor layer 1, a thickness of the second insulating layer 10 is not less than 10 nm and not more than 1 µm, for example.

The second insulating layer 10 has a wider band gap compared with the nitride semiconductor layer, in the same manner as the first insulating layer 13, and thereby it is possible to improve the withstand voltage of the semiconductor device 100. In addition, the second insulating layer 10 does not trap electrons in the channel, and thereby it is possible to reduce current collapse of the semiconductor device 100.

The source pad 7 is electrically connected to the source electrode 11 via the source line 24. The source pad 7 is made of metal, for example. The source pad 7 has a laminated structure of titanium (Ti)/gold (Au), titanium (Ti)/platinum (Pt)/gold (Au), titanium (Ti)/aluminum (Al)/nickel (Ni)/gold (Au), or the like, for example.

The gate pad 9 is electrically connected to the gate electrode 12 via the gate line 25. The gate pad 9 is made of metal, for example. The gate pad 9 may have a laminated structure of titanium (Ti)/gold (Au), titanium (Ti)/platinum (Pt)/gold (Au), titanium (Ti)/aluminum (Al)/nickel (Ni)/gold (Au), or the like, for example.

The source line 24 connects the source electrode 11 and the source pad 7. The source line 24 has a laminated structure of titanium (Ti)/gold (Au), titanium (Ti)/platinum (Pt)/gold (Au), titanium (Ti)/aluminum (Al)/nickel (Ni)/gold (Au), or the like, for example.

The gate line 25 connects the gate electrode 12 and the gate pad second nitride semiconductor layer 2e gate line 25 has a laminated structure of titanium (Ti)/gold (Au), titanium (Ti)/platinum (Pt)/gold (Au), titanium (Ti)/aluminum (Al)/nickel (Ni)/gold (Au), or the like, for example.

Since the second insulating layer 10 exists between the source line 24 and the gate line 25, the source line 24 and the gate line 25 are insulated by the second insulating layer 10.

The source electrode 11 and the gate electrode 12 are embedded inside the semiconductor device 100 by the insulating layers, but since the source electrode 11 electrically connects to the source pad 7, and the gate electrode 12 electrically connects to the gate pad 7, the source pad 7 and the gate pad 9 are located at the same side of the semiconductor device 100 as the drain electrode 8. Accordingly, in the semiconductor device 100, wirings can be connected to the source pad 7, the gate pad 9, and the drain electrode 8 respectively on one surface of the semiconductor device 100.

Hereinafter, an operation of the semiconductor device 100 will be described.

The two-dimensional electron gas layer is formed in the first nitride semiconductor layer 1, in the vicinity of the interface of the second nitride semiconductor layer 2 and the first nitride semiconductor layer 1. A dashed-two dotted line of FIG. 1 indicates a position where the two-dimensional electron gas exists. When a voltage is not applied to the gate electrode 12, since the two-dimensional electron gas layer constantly exists in the first nitride semiconductor layer 1, the semiconductor device 100 is a normally-on transistor.

A negative voltage is applied to the gate electrode 12, so as to stop the flow of electrons in the channel to make the semiconductor device 100 to be in an OFF state. That is, when the negative voltage is applied to the gate electrode 12, the band structure of the interface of the second nitride semiconductor layer 2 and the first nitride semiconductor layer 1 is raised, and the two-dimensional electron gas becomes depleted. For the reason, it is possible to stop the flow of the electrons in the channel of the first nitride semiconductor layer 1.

Hereinafter, an example of a manufacturing method of the semiconductor device 100 will be described using FIGS. 2A-2D.

To begin with, as shown in FIG. 2A, a second buffer layer 23 such as an AlGaN layer, for example, is formed on a substrate 21 such as a Si substrate, via a first buffer layer 22 such as an AlN layer, for example. Further, the first nitride semiconductor layer 1 that is the channel layer and the second nitride semiconductor layer 2 that is the electron supply layer are formed on the second buffer layer 23. In the prior art, the first buffer layer 22 and the second buffer layer 23 are thick film withstand voltage buffer layers having insulation properties. However, in the present embodiment, the buffer layers 22 and 23 need not be provided with insulating properties, and may be thin. An MOCVD device is used for forming the respective layers.

The gate insulating layer 5 is formed on the second nitride semiconductor layer 2 by a CVD method or ALD (Atomic Layer Deposition) method, etc., and further, the gate electrode 12 is formed on the gate insulating layer 5 by sputtering or deposition method etc. A part of the gate insulating layer 5 is removed to expose the second nitride semiconductor layer 2, and the source electrode 11 is formed on the second nitride semiconductor layer 2 by the sputtering. And after the source electrode 11 has been formed, an insulating layer is formed on the source electrode 11 by the CVD method, and a part of the gate line 25 to be connected to the gate electrode 12 is formed on the insulating layer. And the interlayer insulating layer 4 is formed so as to cover the gate electrode 12, the source electrode 11, the gate insulating layer 5, and a part of the gate line 25. The surface of the interlayer insulating layer 4 is made flat, by a method of adjusting the deposition rate, or polishing.

Next, as shown in FIG. 2B, a substrate 6 different from the substrate 21 is prepared. The bonding insulating layer 3 is formed on the substrate 6 by the CVD method. The bonding insulating layer 3 is a layer used for joining with another insulating layer, and the same material as the above-described material of the the first insulating layer 13 may be used. And as shown in FIG. 2B, the bonding insulating layer 3 is joined with the interlayer insulating layer 4. Joining of the bonding insulating layer 3 and the interlayer insulating layer 4 is performed under vacuum at a temperature of 150° C., while pressure is applied to the bonding insulating layer 3 and the interlayer insulating layer 4.

Next, as shown in FIG. 2C, the substrate 21, the first buffer layer 22 and the second buffer layer 23 are removed. Regarding the removal, the substrate 21 is firstly removed by grinding, dry etching, wet etching, or the like. After the substrate 21 has been removed, the first buffer layer 22 and the second buffer layer 23 are removed by wet etching or dry etching, to expose an N polarity surface of the first nitride semiconductor layer 1.

Next, as shown in FIG. 2D, a part of the N polarity surface of the first nitride semiconductor layer 1 is removed, and the drain electrode 8 is embedded therein. The second insulating layer 10 is formed so as to cover the upper surface of the first nitride semiconductor layer 1 and a part of the side surface of the first nitride semiconductor layer 1. The source pad 7 and the source line 24 are formed by the sputtering, and the source pad 7 is connected to an exposed portion of the source electrode 11 via the source line 24. In addition, the source pad 7 is covered by an insulating layer 10 while a part of the source pad 7 is exposed to the upper surface of the second insulating layer 10. Next, the gate pad 9 and the gate line 25 are formed by the sputtering, and the gate pad 9 is connected to an exposed portion of a part of the gate line 25.

In the manufacturing process of the semiconductor device 100, the first buffer layer 22 and the second buffer layer 23 existing on the first nitride semiconductor layer 1 are removed, and the second insulating layer 10 is provided on the first nitride semiconductor layer 1 of the semiconductor device 100.

Figure 3:
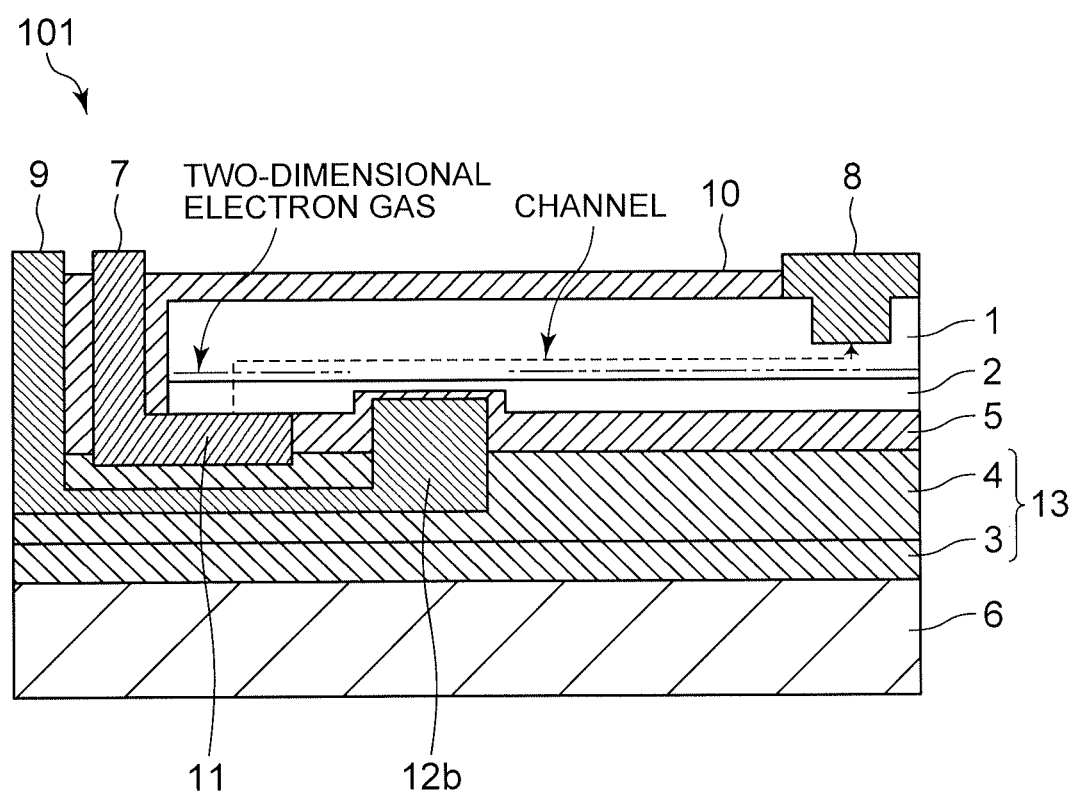
FIG. 3 is a schematic sectional view of a semiconductor device of a second embodiment.

(Second embodiment) FIG. 3 shows a semiconductor device 101. The same symbols are given to the same portion as the semiconductor device 100 of FIG. 1, and the description thereof will be omitted.

The semiconductor device 100 is a normally-off transistor which is provided with a gate electrode 12b embedded in the second nitride semiconductor layer 2 via the gate insulating layer 5 having a concave portion.

The gate electrode 12b exists between the second nitride semiconductor layer 2 and the substrate 6, and is embedded in the first insulating layer 13. The second nitride semiconductor layer 2 has a concave portion, and the gate electrode 12b exists in the above-described concave portion via the gate insulating layer 5. The gate electrode 12b is connected to the gate pad 9.

The gate electrode 12b is made of metal, for example. The metal is any of titanium (Ti), nickel (Ni) and titanium nitride (TiN), or a laminated structure of these. In addition, a thickness of the gate insulating layer 5 is preferably not less than 10 nm and not more than 50 nm, for example, so as to prevent the carriers from leaking out from the channel of the first nitride semiconductor layer 1 to the gate electrode 12b.

Hereinafter, an operation of the semiconductor device 101 will be described.

The two-dimensional electron gas layer is formed in the first nitride semiconductor layer 1, in the vicinity of the interface of the second nitride semiconductor layer 2 and the first nitride semiconductor layer 1. A dashed-two dotted line of FIG. 3 shows a position where the two-dimensional electron gas exists. Since the thickness of the second nitride semiconductor layer 2 above the gate electrode 12b is thin, the concentration of the two-dimensional electron gas layer existing in the first nitride semiconductor layer 1 overlapping above this portion is low. Accordingly, a threshold voltage of the semiconductor device 101 is improved. The semiconductor device 101 is normally off in the state in which a voltage is not applied to the gate line electrode 12b.

When a positive voltage is applied to the gate electrode 12b, the first nitride semiconductor layer 1 above the gate electrode 12b becomes in a storage state in which electrons are to be induced. For the reason, electrons induced in the storage state couple with the two-dimensional electron gas layer existing at the interface of the second nitride semiconductor layer 2 and the first nitride semiconductor layer 1. Accordingly, a current flows in the direction of an arrow shown by a dotted line of FIG. 3. By this means, the semiconductor device 101 operates as an FET.

In addition, the bottom portion of the concave portion provided in the second nitride semiconductor layer 2 may reach the first nitride semiconductor layer 1, and the gate electrode 12b may be embedded in the first nitride semiconductor layer 1 via the gate insulating layer 5.

As described above, the semiconductor device 101 is further provided with the gate electrode 12b embedded in the second nitride semiconductor layer 2 via the gate insulating layer 5, and thereby the semiconductor device 101 becomes a normally-off transistor.

The semiconductor device 101 is provided with the first insulating layer 13 in place of the withstand voltage buffer layer. Accordingly, it is possible to improve the withstand voltage of the semiconductor device 101. In addition, the first insulating layer 13 does not store electrons which have leaked out from the channel or does not allow the electrons to pass therethrough, and thereby the electrons can be prevented from leaking out from the channel to the first insulating layer 13, and accordingly, it is possible to reduce current collapse. In addition, the semiconductor device 101 has the concave portions in the gate insulating layer 5 and in the first insulating layer 13, and since the gate electrode 12b is embedded in the concave portion, it is possible to make the semiconductor device 101 perform a normally-off operation.

The semiconductor device 101 can be manufactured in the same manner as the manufacturing method of the semiconductor device 100 of the first embodiment except the following points.

In the manufacture of the semiconductor device 101, before the process to laminate the gate insulating layer 5 on the second nitride semiconductor layer 2 shown in FIG. 2A, the concave portion is formed in the second nitride semiconductor layer 2. And, the gate insulating layer 5 is laminated along the concave portion, and further the gate electrode 12 is formed on the gate insulating layer 5 of the concave portion.

Figure 4:
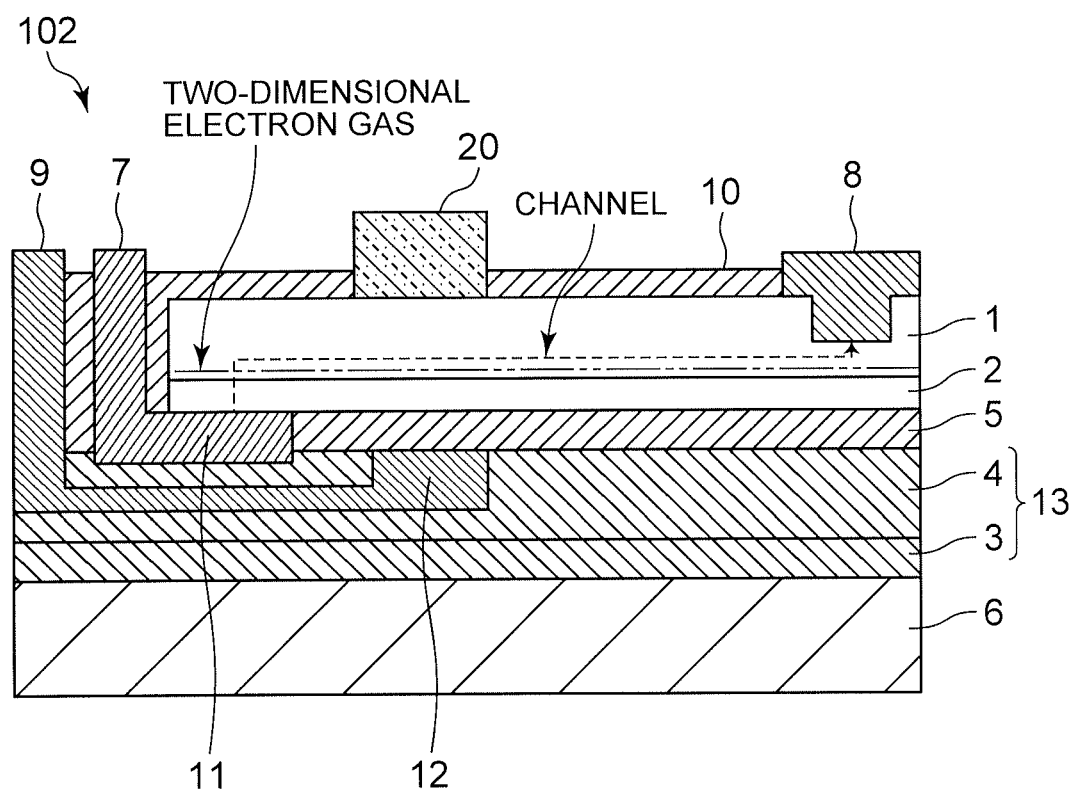
FIG. 4 is a schematic sectional view of a semiconductor device of a third embodiment.

(Third embodiment) FIG. 4 shows a semiconductor device 102.

The same symbols are given to the same portions as the semiconductor device 100 of FIG. 1, and the description thereof will be omitted.

The semiconductor device 102 is further provided with a third nitride semiconductor layer 20.

The third nitride semiconductor layer 20 is on the first nitride semiconductor layer 1, and is opposite to the gate electrode 12 while sandwiching the gate insulating layer 5, the second nitride semiconductor layer 2, and the first nitride semiconductor layer 1 therebetween. The third nitride semiconductor layer 20 is an aluminum gallium nitride ($Al_{x3}Ga_{(1-x3)}N$, $0 \le x3 < 1$) layer. The third nitride semiconductor layer 20 is an aluminum gallium nitride (AlGaN) layer or a gallium nitride (GaN) layer.

When the third nitride semiconductor layer 20 is the AlGaN layer, the third nitride semiconductor layer 20 is an i-AlGaN layer in which impurities are not intentionally doped, or a p-type p-AlGaN layer. An impurity concentration of the i-AlGaN layer is not more than $1 \times 10^{21}$ cm$^{-3}$. A p-type impurity of the p-AlGaN layer is magnesium, carbon, or the like, for example. An impurity concentration of the p-AlGaN layer is not less than $1 \times 10^{18}$ cm$^{-3}$ and not more than $1 \times 10^{21}$ cm$^{-3}$.

When the third nitride semiconductor layer 20 is the GaN layer, it is a p-GaN layer. A p-type impurity of the p-GaN layer is magnesium (Mg), carbon (C), or the like, for example. An impurity concentration of the p-GaN layer is not less than $1 \times 10^{18}$ cm$^{-3}$ and not more than $1 \times 10^{21}$ cm$^{-3}$.

The third nitride semiconductor layer 20 is at the position opposite to the gate electrode 12, and thereby the band structure of an AlGaN/GaN hetero interface existing above the gate line electrode 12 is raised, and the two-dimensional electron gas becomes depleted. By this means, it is possible to make the semiconductor device 102 that has been normally-on to be normally-off. In addition, since the band structure of the AlGaN/GaN hetero interface existing above the gate electrode 12 is raised, it is possible to improve the threshold value of the semiconductor device 102. Further, a positive voltage is applied to the gate electrode 12 to lower the band structure, and thereby it is possible to flow the two-dimensional electron gas in the channel, and it is possible to make the semiconductor device 102 operate.

In addition, in order to prevent that the band structure is raised at the whole interface of the second nitride semiconductor layer 2 and the first nitride semiconductor layer 1, the third nitride semiconductor layer 20 is not left on the whole upper surface of the first nitride semiconductor layer 1, but is partially left only on the position opposite to the gate electrode 12.

As described above, the semiconductor device 102 can improve the withstand voltage, and can reduce current collapse, in the same manner as the first embodiment. And the third nitride semiconductor layer 20 is provided on the first nitride semiconductor layer 1 and is made opposite to the gate electrode 12, and thereby the band structure of the AlGaN/GaN hetero interface existing above the gate electrode 12 is raised, and it is possible to make the semiconductor device 102 to be normally-off.

The semiconductor device 102 can be manufactured in the same manner as the manufacturing method of the semiconductor device 100 of the first embodiment except the following points.

In the process of FIG. 2A, a nitride semiconductor layer from which the third nitride semiconductor layer 20 will be made is previously formed between the second buffer layer 23 and the first nitride semiconductor layer 1.

In the process of FIG. 2C, the nitride semiconductor layer from which the third nitride semiconductor layer 20 will be made is not wholly removed, but only a portion thereof opposite to the gate electrode 12 is left using a patterned resist as a mask. A patterned insulating film may be used as the mask. The left portion becomes the third nitride semiconductor layer 20. Then, the second insulating film 10 is formed on the first nitride semiconductor layer 1

In addition, the nitride semiconductor layer from which the third nitride semiconductor layer 20 will be made is not previously formed, but a part of the second buffer layer 23 may be left to use as the third nitride semiconductor layer 20. In this case, the second buffer layer 23 existing on the first nitride semiconductor layer 1 is not wholly removed, but only a portion thereof opposite to the gate electrode 12 is left using a patterned resist as the mask. A patterned insulating film may be used as the mask. The buffer layer 23 of the left portion becomes the third nitride semiconductor layer 20. Then, the second insulating film 10 is formed on the first nitride semiconductor layer 1.

Figure 5:
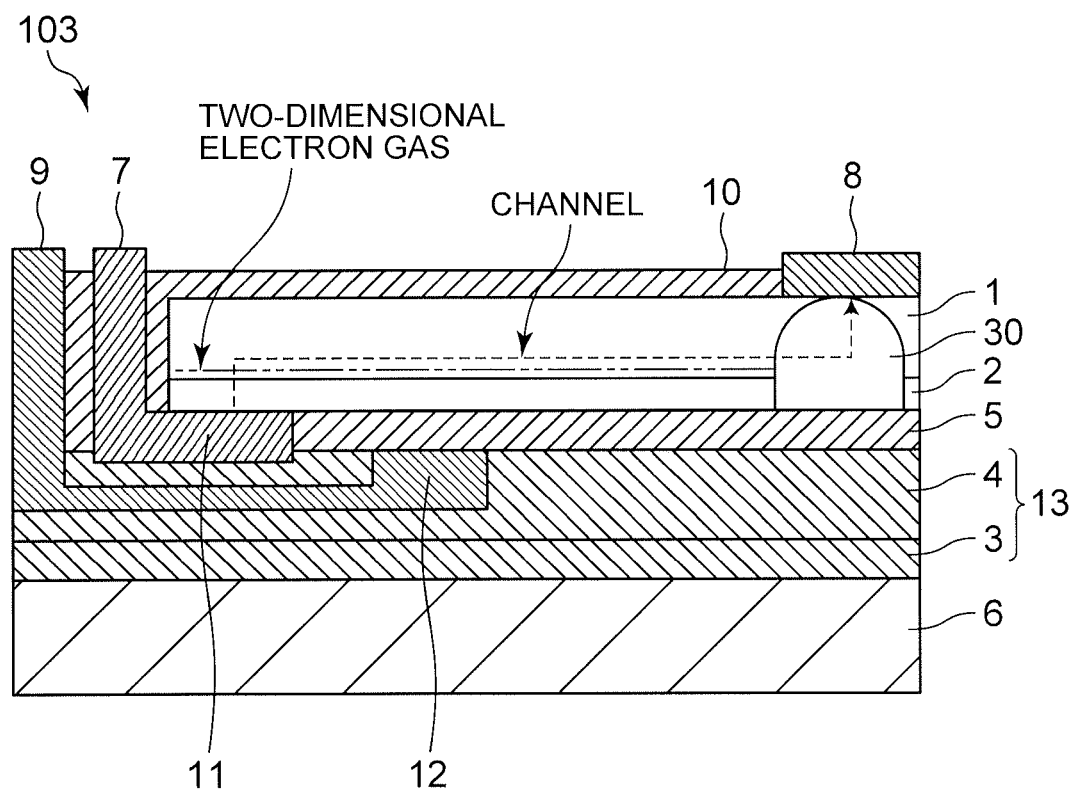
FIG. 5 is a schematic sectional view of a semiconductor device of a fourth embodiment.

(Fourth embodiment) FIG. 5 shows a semiconductor device 103.

The same symbols are given to the same portions as the semiconductor device 100 of FIG. 1, and the description thereof will be omitted.

The semiconductor device 103 is provided with a drain electrode 8a instead of the drain electrode 8, and further provided with a region 30.

The drain electrode 8a is provided on the first nitride semiconductor layer 1. Different from the drain electrode 8 of FIG. 1 as described above, the drain electrode 8a is not embedded in the first nitride semiconductor layer 1. The drain electrode 8a is made of ohmic metal, for example. The metal has a laminated structure of titanium (Ti), aluminum (Al), nickel (Ni), and gold (Au), for example.

The region 30 is inside the first nitride semiconductor layer 1 and the second nitride semiconductor layer 2, and is between the drain electrode 8a and the first insulating layer 13. The region 30 is formed by ion-implanting silicon (Si) into the first nitride semiconductor layer 1 and the second nitride semiconductor layer 2. A conductivity type of the region 30 is an n-type. In order to improve conduction of the two-dimensional electron gas between the drain electrode 8a and the channel, an n-type impurity concentration of the region 30 is preferably not less than $1 \times 10^{18}$ cm$^{-3}$ and not more than $1 \times 10^{20}$ cm$^{-3}$ (or $1 \times 10^{14}$ cm$^{-2}$ and not more than $1 \times 10^{16}$ cm$^{-2}$ in area density).

In addition, the region 30 may be formed by a method of selectively regrowing a Si-doped GaN layer only beneath a portion where the drain electrode 8a is to be formed, in place of ion-implanting silicon into the first nitride semiconductor layer 1 and the second nitride semiconductor layer 2 beneath the portion.

As described above, the semiconductor device 103 can improve the withstand voltage, and can reduce current collapse, in the same manner as the first embodiment. In addition, even when the drain electrode 8a is not embedded in the first nitride semiconductor layer 1, the region 30 is provided between the drain electrode 8a and the first insulating layer 13, and thereby it is possible to improve conduction between the drain electrode 8a and the channel.

The semiconductor device 103 can be manufactured in the same manner as the manufacturing method of the semiconductor device 100 of the first embodiment except the following points.

Before the process of FIG. 2A, or in FIG. 2C or FIG. 2D, silicon (Si) is ion-implanted into the first nitride semiconductor layer 1 beneath a portion where the drain electrode 8a is to be formed. Accordingly, the n-type region 30 is formed in the first nitride semiconductor layer 1. At this time, silicon may be ion-implanted not only into the first nitride semiconductor layer 1 but also into the second nitride semiconductor layer 2. After silicon has been ion-implanted into the first nitride semiconductor layer 1, the drain electrode 8a and the second insulating layer 10 are formed on the first nitride semiconductor layer 1.

Figure 6:
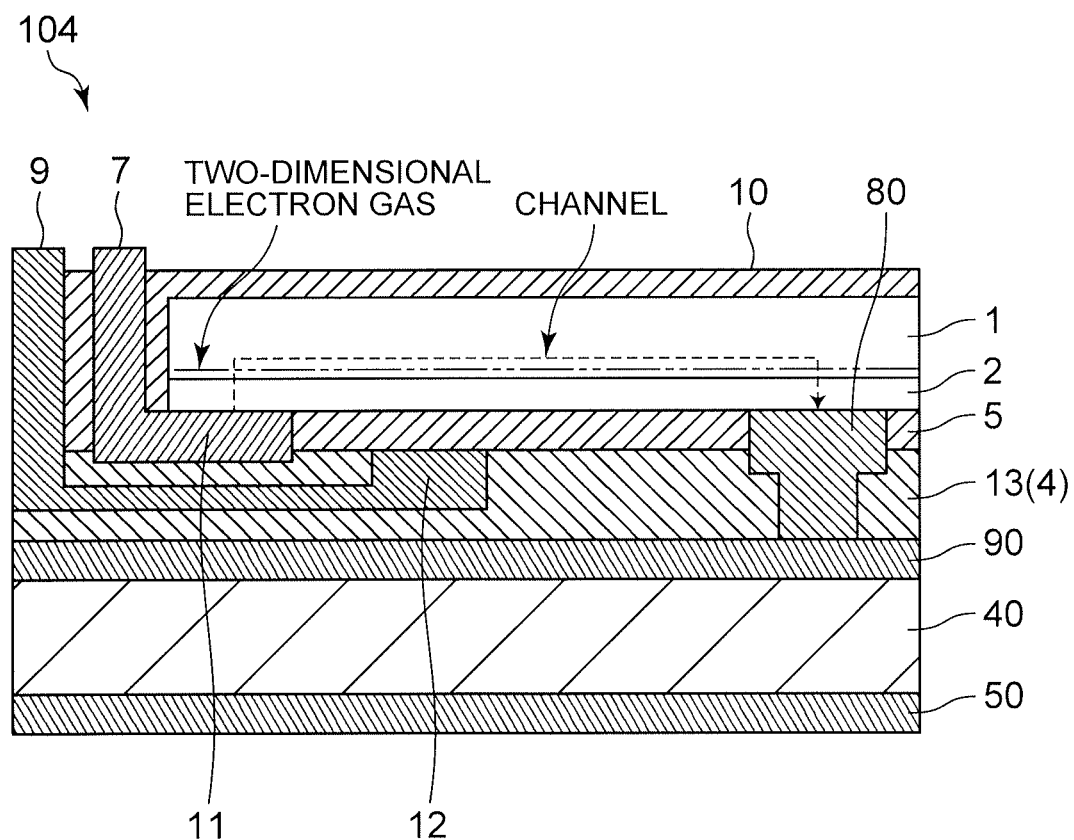
FIG. 6 is a schematic sectional view of a semiconductor device of a fifth embodiment.

(Fifth embodiment) FIG. 6 shows a semiconductor device 104.

The same symbols are given to the same portions as the semiconductor device 100 of FIG. 1, and the description thereof will be omitted.

The semiconductor device 104 is further provided with a conductive substrate 40, a drain electrode 80, a first conductive layer 50 (drain electrode terminal), and a second conductive layer 90 (drain electrode terminal).

The conductive substrate 40, the first conductive layer 50, and the second conductive layer 90 are provided at a side opposite to the side where the source pad 7 and the gate pad 9 are provided, and thereby the conduction can be obtained in the rear surface of the semiconductor device 104.

The semiconductor device 104 has a structure in which the conductive substrate 40, the second conductive layer 90, and the first insulating layer 13 are laminated in this order on the first conductive layer 50. In addition, the interlayer insulating layer 4 is included in the insulating layer 13.

The drain electrode 80 is provided between the second nitride semiconductor layer 2 and the second conductive layer 90, and inside the first insulating layer 13 and the gate insulating layer 5. The drain electrode 80 is made of metal, for example, and the metal has a laminated structure of titanium (Ti) and aluminum (Al), for example. The drain electrode 80 conducts electrons flowing in the channel to the second conductive layer 90.

The second conductive layer 90 is between the first insulating layer 13 and the conductive substrate 40. The second conductive layer 90 is made of metal, such as, gold (Au) and an alloy of gold (Au) and tin (Sn), for example. The second conductive layer 90 conducts the electrons from the drain electrode 80 to the conductive substrate 40.

The conductive substrate 40 is between the second conductive layer 90 and the first conductive layer 50. The conductive substrate 40 is made of metal, such as, copper (Cu) and aluminum (Al), for example. The conductive substrate 40 conducts the electrons from the second conductive layer 90 to the first conductive layer 50.

The first conductive layer 50 is provided on the conductive substrate 40 at a side opposite to the side where the second conductive layer 90 is provided. The first conductive layer 50 is made of metal. The metal has a laminated structure of titanium (Ti), aluminum (Al), nickel (Ni) and gold (Au), for example.

As described above, the semiconductor device 104 can improve the withstand voltage and can reduce current collapse, in the same manner as the first embodiment. In addition, the conductive substrate 40, the drain electrode 80 and the second conductive layer 90 are provided, and in the laminated structure, the first conductive layer 50 is provided at a side opposite to the side where the source pad 7 and the gate pad 9 are provided, and thereby the conduction can be obtained in the rear surface of the semiconductor device 104. By this means, at the time of manufacturing the semiconductor device 104, the implementation of the first conductive layer 50 can be simplified.

The semiconductor device 104 can be manufactured in the same manner as the manufacturing method of the semiconductor device 100 of the first embodiment except the following points. In FIG. 2A, after the gate insulating layer 5 and the interlayer insulating layer 4 have been laminated on the second nitride semiconductor layer 2, a part of the gate insulating layer 5 and a part the interlayer insulating layer 4 are removed to expose the second nitride semiconductor layer 2. The drain electrode 80 is formed on the exposed portion of the second nitride semiconductor layer 2.

In addition, in FIG. 2B, the conductive substrate 40 is prepared in place of the substrate 6. Before the laminating body manufactured in FIG. 2A is joined to the conductive substrate 40, the second conductive layer 90 is previously laminated on the conductive substrate 40. Further, the first conductive layer 50 is previously formed on the conductive substrate 40 at a side opposite to the side where the second conductive layer 90 is provided.

Figure 7:
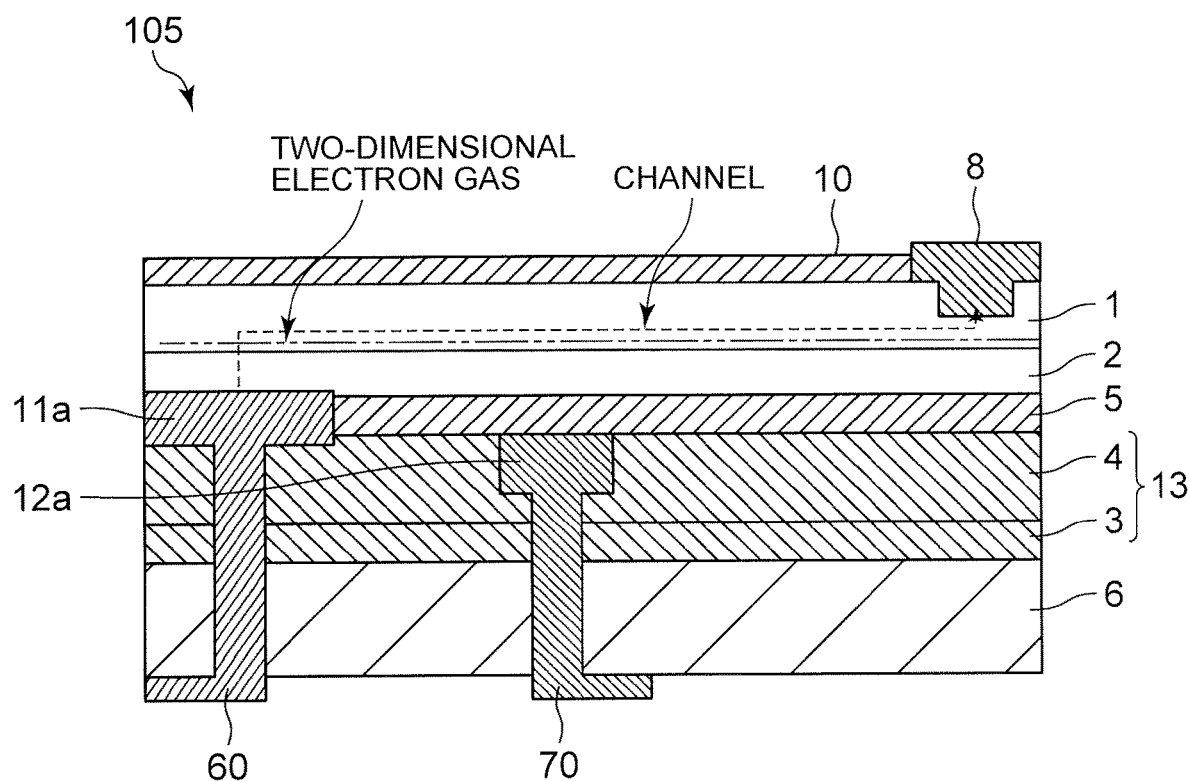
FIG. 7 is a schematic sectional view of a semiconductor device of a sixth embodiment.

(Sixth embodiment) FIG. 7 shows a semiconductor device 105.

The same symbols are given to the same portions as the semiconductor device 100 of FIG. 1, and the description thereof will be omitted.

The semiconductor device 105 is provided with a source pad 60 and a gate pad 70 on the substrate 6.

The source pad 60 is provided on the substrate 6 at a side opposite to the side where the first insulating layer 13 is provided, and connects to a source electrode 11a via a source line 24a. The source pad 60 and the source line 24a are each made of aluminum (Al), copper (Cu), Gold (Au), or the like, for example.

The gate pad 70 is provided on the substrate 6 at the side opposite to the side where the first insulating layer 13 is provided. In addition, the gate pad 70 connects to a gate electrode 12a via a gate line 25a. The gate pad 70 and the gate line 25a are each made of metal, for example. The metal is any of titanium (Ti), nickel (Ni), and titanium nitride (TiN), or a laminated structure of these.

As described above, the semiconductor device 105 can improve the withstand voltage and can reduce current collapse, in the same manner as the first embodiment. In addition, in the laminated structure, the source pad 60 and the gate pad 70 are provided at a side opposite to the side where the drain electrode 8 is provided, and thereby the conduction can be obtained in the rear surface of the semiconductor device 105.

The semiconductor device 105 can be manufactured in the same manner as the manufacturing method of the semiconductor device 100 of the first embodiment except the following points.

In FIG. 2A, a part of the gate line connected to the gate electrode 12 is not formed.

In FIG. 2C, a part of the substrate 6 and a part of the first insulating layer 13 which are opposite to the source electrode 11 and the gate electrode 12 are removed to expose the source electrode 11 and the gate electrode 11. Metal is laminated from the substrate 6 side, and thereby the source line and the source pad 60 which are connected to the source electrode 11, and the gate line and the gate pad 70 which are connected to the gate electrode 12 are respectively formed.

The source line, the source pad 60, the gate line, and the gate pad 70 are previously formed in and on the substrate 6, and these may be respectively connected to the source electrode 11 and the gate electrode 12 by joining.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a first nitride semiconductor layer having a concave portion;
   a first insulating layer provided between the substrate and the first nitride semiconductor layer;
   a gate insulating layer provided between the first insulating layer and the first nitride semiconductor layer;
   a second nitride semiconductor layer provided between the gate insulating layer and the first nitride semiconductor layer, and being in contact with the first nitride semiconductor layer;
   a source electrode provided between the first insulating layer and the second nitride semiconductor layer, and electrically connected to the second nitride semiconductor layer;
   a gate electrode provided between the gate insulating layer and the first insulating layer, wherein at least a part of the gate electrode is provided in the concave portion of the first nitride semiconductor layer; and
   a drain electrode provided on the second nitride semiconductor layer, and electrically connected to the first nitride semiconductor layer.

2. The semiconductor device according to claim 1 further comprising:
   a second insulating layer provided on the first nitride semiconductor layer.

3. The semiconductor device according to claim 1, wherein the drain electrode has a convex portion, and the convex portion is embedded in the first nitride semiconductor layer.

4. The semiconductor device according to claim 2 further comprising:
   a source pad electrically connected to the source electrode and provided on the second insulating layer; and
   a gate pad electrically connected to the gate electrode and provided on the second insulating layer.

5. The semiconductor device according to claim 1 further comprising:
   a third nitride semiconductor layer provided on the first nitride semiconductor layer, and being opposite to the gate electrode.

6. The semiconductor device according to claim 5, wherein the third nitride semiconductor layer includes $Al_{x1}Ga_{(1-x1)}N$ ($0 \leq x1 < 1$).

7. The semiconductor device according to claim 1 further comprising:
   an n-type region provided between the drain electrode and the gate insulating layer.

8. The semiconductor device according to claim 1 further comprising:
   a source pad electrically connected to the source electrode and provided on an opposite side of the substrate from the first insulating layer; and
   a gate pad electrically connected to the gate electrode and provided on an opposite side of the substrate from the first insulating layer.

9. The semiconductor device according to claim 1, wherein the substrate is insulator.

10. The semiconductor device according to claim 1, wherein the second nitride semiconductor layer includes $Al_{x1}Ga_{(1-x1)}N$ ($0 < x1 \leq 1$).

11. The semiconductor device according to claim 1, wherein the first nitride semiconductor layer includes GaN.

12. The semiconductor device according to claim 1, wherein a thickness of the second nitride semiconductor layer is not less than 20 nm and not more than 1 µm.

13. A semiconductor device comprising:
    a substrate;
    a first nitride semiconductor layer;
    a first insulating layer provided between the substrate and the first nitride semiconductor layer;
    a gate insulating layer provided between the first insulating layer and the first nitride semiconductor layer;
    a second nitride semiconductor layer provided between the gate insulating layer and the first nitride semiconductor layer, and being in contact with the first nitride semiconductor layer;
    a source electrode provided between the first insulating layer and the second nitride semiconductor layer, and electrically connected to the second nitride semiconductor layer;
    a gate electrode provided between the first insulating layer and the gate insulating layer;
    a drain electrode provided between substrate and the second nitride semiconductor layer, and electrically connected to the second nitride semiconductor layer and substrate; and
    a first conductive layer provided between the substrate and the first insulating layer and electrically connected to the drain electrode.

14. The semiconductor device according to claim 13 further comprising:
    a second conductive layer provided on an opposite side of the substrate from the first insulating layer.

15. The semiconductor device according to claim 13, wherein the substrate is a conductor.

* * * * *